United States Patent [19]
Jung et al.

[11] Patent Number: 6,017,676
[45] Date of Patent: Jan. 25, 2000

[54] PHOTORESIST COMPOSITION COMPRISING A COPOLYMER RESIN

[75] Inventors: Jae Chang Jung; Cha Won Koh, both of Ichon, Rep. of Korea

[73] Assignee: Hyundai Electronics Industries Co., Ltd., Kyoungki-do, Rep. of Korea

[21] Appl. No.: 08/863,147

[22] Filed: May 27, 1997

[30] Foreign Application Priority Data

Jun. 29, 1996 [KR] Rep. of Korea ................. 96-25720

[51] Int. Cl.$^7$ ................................................. G03C 1/73
[52] U.S. Cl. ................................... 430/270.1; 430/281.1
[58] Field of Search ........................... 430/270.1, 281.1

[56] References Cited

U.S. PATENT DOCUMENTS

| | | | |
|---|---|---|---|
| 4,837,124 | 6/1989 | Wu et al. ........................... | 430/270.1 |
| 4,891,306 | 1/1990 | Yokoyama et al. .................. | 430/527 |

FOREIGN PATENT DOCUMENTS

| | | |
|---|---|---|
| 6-138658 | 5/1994 | Japan . |
| 7-5684 | 1/1995 | Japan . |
| 08073428 A2 | 3/1996 | Japan . |
| 8-73428 | 3/1996 | Japan . |

OTHER PUBLICATIONS

Turner et al., Polym. Eng. Sci (1986), 26(16), 1096–100; see CAS Accession No. 1986:600374 and abstract.

Kim et al., Pollimo (1997), 21(1), 1–6; see CAS Accession No. 1997:205910 and abstract.

Ahn et al., Polymer (1995), 36(13), 2621–8; see CAS Accession No. 1995:664303 and abstract.

Chiang et al., J. Appl. Polym. Sci. (1993), 50(6), 1007–12; see CAS Accession No. 1994:19016 and abstract.

Turner, S. Richard et al. "Thermally stable, deep UV resist materials". Polym. Mater. Sci. Eng., 55, pp. 608–610, 1986.

CA abstract 125:11728, 1996.
CA abstract 122:303028, 1995.
CA abstract 122:118982, 1994.

*Primary Examiner*—Maria Nuzzolillo
*Assistant Examiner*—Laura Weiner
*Attorney, Agent, or Firm*—Nath & Associates; Gary M. Nath; Lee C. Heiman

[57] ABSTRACT

A photoresist composition suitable for forming fine patterns of semiconductor devices, comprising a resin, a photosensitive acid generator and additives. The resin has a cyclic structure which is superior in thermal resistance and etch resistance as well as allowing for a light source of 200 nm or a shorter wavelength.

2 Claims, No Drawings

PHOTORESIST COMPOSITION COMPRISING A COPOLYMER RESIN

BACKGROUND OF THE INVENTION

1. Field of the Invention

The present invention relates to a photoresist composition comprising a resin which enables a deep ultra violet (hereinafter referred to as "DUV") beam to be used as a light source, said photoresists composition having high thermal resistance and etch resistance. More particularly, the present invention relates to the use of polymaleic imide resin in a photoresist composition, thereby improving the production yield and reliability of semiconductor devices. Also, the present invention is concerned with a preparing method of the photoresist composition and a method for forming a fine pattern from the photoresist composition.

2. Description of the Prior Art

Using a pattern formed on a silicon substrate as a mask, dopants are implanted in the silicon substrate under an accurate control, and the implanted regions in the silicon substrate are interconnected to form elements or circuits. The pattern defining such implanted regions is usually obtained by an exposure process. A photoresist film is coated on a wafer and exposed, through a patterned mask, to light with a certain wavelength, for example, uv ray, electron beam or X ray. Thereafter, taking advantage of the solubility difference between the exposed region and the unexposed region, the photoresist film is developed to form a pattern. This pattern functions to protect the substrate, as well as serving as a barrier upon etching or ion-implantation.

A photoresist film composition typically comprises a resin consisting of polymer, a photosensitive acid generator, and other additives. The polymer, a base of the photoresist film, has a structure in which an alkyl group is repeated forming a large chain. Upon exposing the composition to a beam with a certain wavelength, a photochemical reaction occurs via the photosensitive acid generator.

The photoresist pattern prepared from the composition has a resolution power represented by the following formula:

$$R = k \times \lambda / NA$$

wherein k is a process constant; $\lambda$ is a wavelength of a light source; and NA is a numerical aperture. As indicated, the resolution power is proportional to the wavelength and the process constant but inversely proportional to the numerical aperture. It is very difficult to reduce the process constant and increase the numerical aperture to certain values. This is the main factor in improving the resolution. In fact, it is virtually impossible to form a fine pattern necessary for 1 giga or higher integration of a semiconductor device by controlling the process constant or numerical aperture.

Accordingly, research has been directed to find new light sources suitable to improve the resolution power. As a result, a DUV ray was developed as a light source for the integration of semiconductor devices into 1 giga or a higher scale. Examples of the DUV light source include krypton fluoride excimer laser (hereinafter referred to as "KrF") and argon fluoride excimer laser (hereinafter referred to as "ArF") which are 248 nm and 193 nm in wavelength, respectively. According to the finding of a new light source, a suitable photoresist film should be developed.

In order to better understand the background of the present invention, a description will be given of a conventional photoresist film resin for DUV rays.

A conventional photoresist film composition for KrF comprises a polyvinylphenol resin and a photosensitive acid generator as follows:

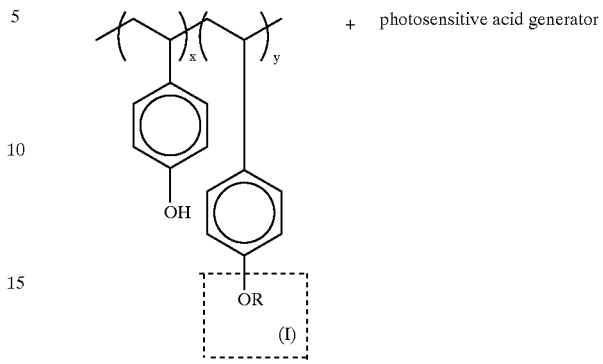

wherein R is an alkyl moiety functioning as a dissolution inhibitor. A typical dissolution inhibitor is the tert-butoxycarbonyloxy group.

When the photosensitive acid generator is exposed to UV, a proton is generated and, then, reacts with the alkyl moiety to generate another proton as follows:

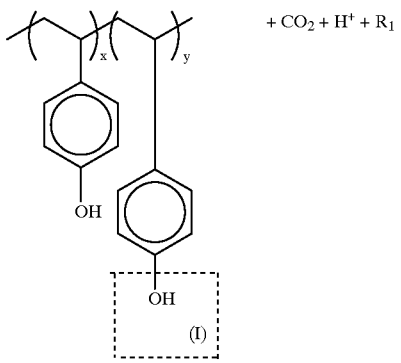

When the alkyl moiety is tert-butoxycarbonyloxy, $R_1$ is isobutylene. In sequence, the proton is used for such a reaction. Thus, the resin containing no dissolution inhibitor moiety is dissolved in a developing solution while the unexposed resin is not dissolved.

The polyvinylphenol type resins used for KrF light source show maximal uv absorbance around 210 nm and 270 nm. When a pattern is formed away from the absorbance range using KrF (248 nm) as a light source, the polyvinylphenol type resins can be used as photoresist resins. However, in a lithography process using ArF (193 nm) as a light source, any resin that absorbs ArF light, including polyvinyl type resin, cannot be used as a photoresist resin. The reason is that the resin showing a maximal absorbance at 210 nm can also absorb the beam with a wavelength of 193 nm. Owing to this, the photochemical reaction of the photosensitive acid generator is restrained. The resin, if used, gives an altered pattern.

Currently, a polymethylmethacrylate (hereinafter referred to as "PMMA") resin, represented by the following structural formula I, or an aromatic resin, represented by the following structural formula II, is used as a photoresist resin for ArF:

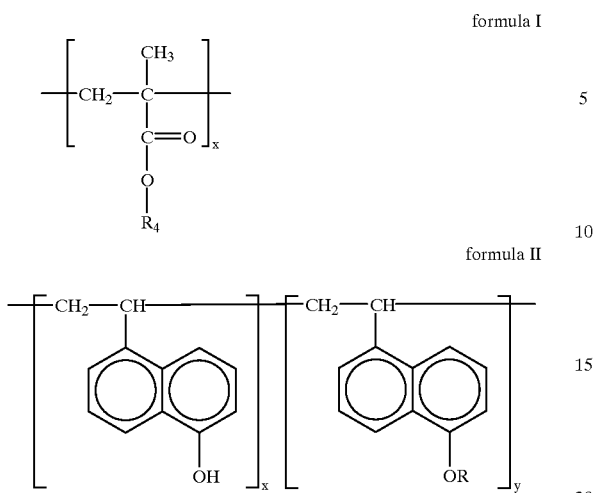

formula I formula II

R=dissolution inhibitor
wherein R is an alkyl moiety functioning as a dissolution inhibitor.

The photoresist film patterns from these resins, however, are so poor in etch resistance and thermal resistance that they are unsuitable for forming highly fine patterns of high density. Further, the photoresist film patterns are difficult to use in practice because they are altered.

SUMMARY OF THE INVENTION

An objective of the present invention is to overcome the above problems encountered in prior arts and to provide a photoresist composition of high thermal resistance and etch resistance, which allows a deep ultra violet (hereinafter referred to as "DUV") beam to be used as a light source.

Another objective of the present invention is to provide a method for preparing the photoresist composition.

A further objective of the present invention is to provide a method for forming a fine photoresist pattern of semiconductor devices.

In accordance with an aspect of the present invention, a photoresist composition comprising poly (N-4-hydroxyphenyl maleimide-co-N-4-ethoxymethoxyphenyl maleimide) as a resin is provided.

In accordance with another aspect of the present invention, there is provided a method for preparing a poly (N-4-hydroxyphenyl maleimide-co-N-4-ethoxymethoxyphenyl maleimide), comprising the step of: reacting maleic anhydride with a phenolic compound in a tetrahydrofuran; amidizing the product with acetic anhydride in the presence of a catalyst; esterifying the amidized product with an acid in ethanol; polymerizing the esterified product in the presence of a radical initiator; and reacting the polymer thus obtained with chloromethylethyl ether in the presence of a base.

DETAILED DESCRIPTION OF THE INVENTION

The photoresist resin for a DUV ray according to the present invention is poly-N-4-hydroxyphenyl maleimide-co-N-(4-ethoxymethoxyphenyl) maleimide, represented by the following structural formula III:

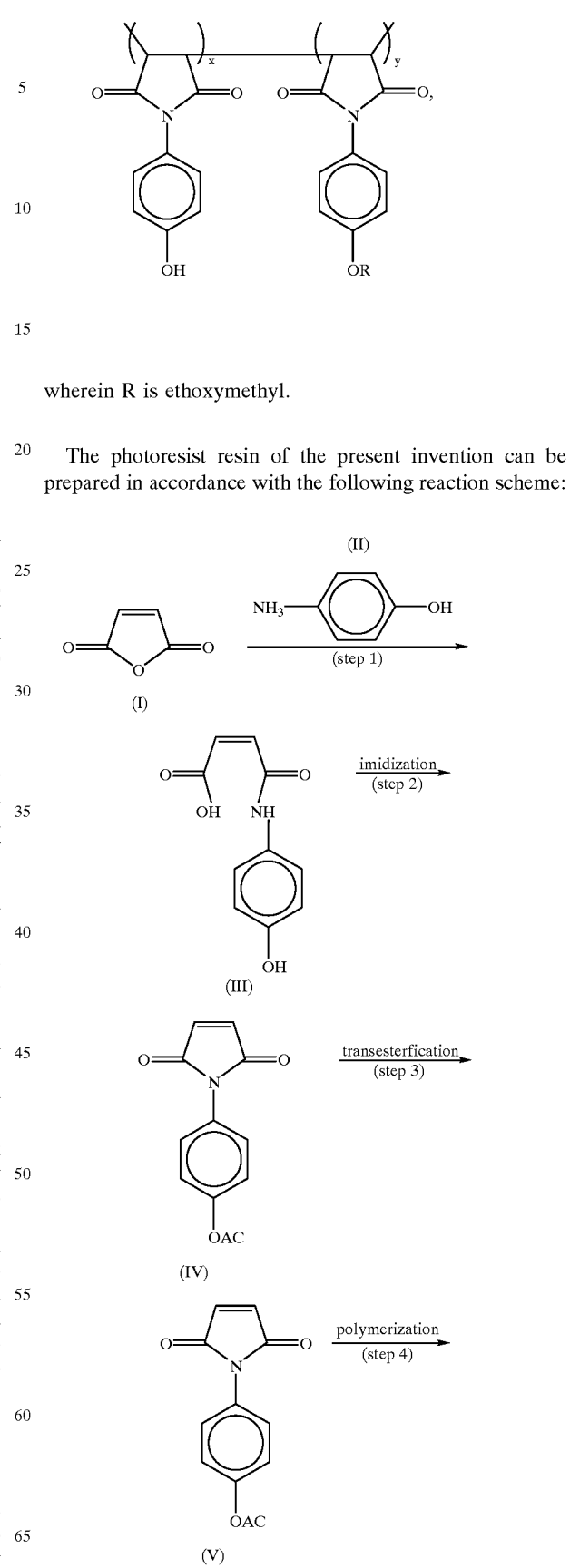

wherein R is ethoxymethyl.

The photoresist resin of the present invention can be prepared in accordance with the following reaction scheme:

-continued

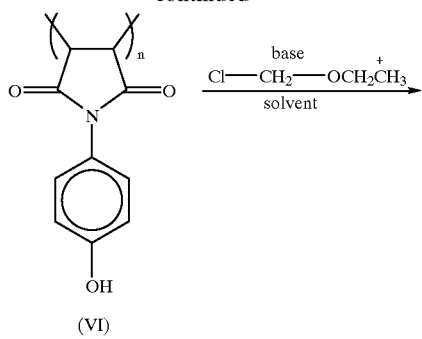

(VI)

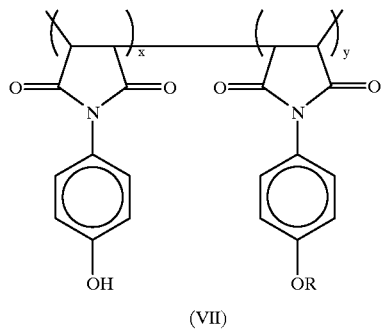

(VII)

A better understanding of the present invention may be obtained in light of the following examples which are set forth to illustrate, but are not to be construed to limit, the present invention.

EXAMPLE I

As indicated by the Reaction Scheme, maleic anhydride (I) was first reacted with para- (ortho- or meta-) aminophenol (II) in tetrahydrofuran to give N-4-hydroxyphenyl maleamic acid (III) which was, then, refluxed together with acetic anhydride at 120° C. in the presence of a catalyst, such as sodium acetate, to obtain N-4-acetoxy phenyl maleimide (IV). After being dissolved in ethanol, the compound IV was refluxed along with at least one selected from the group consisting of para-toluene sulfonic acid, ortho-toluene sulfonic acid, meta-toluene sulfonic acid and hydrochloric acid, to give N-4-hydroxyphenyl maleimide (V). Using a radical initiator, such as azo-iso-butyronitride (AIBN), dibenzoyl peroxide (BPO) or di-tert-butylperoxide, N-4-hydroxyphenyl maleimide (V) was polymerized into a polymaleic imide resin (VI). Following dissolution in a solvent, the polymer (VI) was reacted with chloromethylethyl ether (Cl—CH$_2$—OCH$_2$CH$_3$) in the presence of a base selected from the group consisting of triethyl amine, potassium-tert-butoxide, potassium hydroxide (KOH), potassium methoxide (KOCH$_3$), potassium ethoxide (KOCH$_2$CH$_3$), sodium-tert-butoxide, sodium hydroxide (NaOH), sodium methoxide (NaOCH$_3$), sodium ethoxide (NaOCH$_2$CH$_3$), sodium hydride (NaH), potassium carbonate (K$_2$CO$_3$), sodium ethoxide (NaOCH$_2$C$_3$), sodium hydride (NaH) and sodium carbonate (Na$_2$CO$_3$), to create poly (N-4-hydroxyphenyl maleimide-co-N-4-ethoxymethoxyphenyl maleimide) (VII), a photoresist resin for ArF.

Instead of the ethoxymethyl group, 2-tetrahydropyranyl, 2-tetrahydrofuranyl, 2-methyl-2-tetrahydroxypyranyl, 2-methyl-2-tetrahydrofuranyl, tert-butyl, tert-butoxyethyl, 2-methoxy-2-propyl, 2-ethoxy-2-propyl, 2-methylpropoxyethyl, methylethoxy-2-propyl, or ethoxyethyl can be used as a dissolution inhibitor moiety.

EXAMPLE II

The compound (V) was dissolved in a solvent and reacted with chloromethylethyl ether in the presence of such a base as in Example I to produce N-4-ethoxymethoxyphenyl maleimide. This was mixed with the compound (V) and subjected to polymerization using a radical initiator to obtain the polymer (VII).

EXAMPLE III

After being dissolved in a solvent, the polymer (VI) was reacted with di-tert-butyldicarbonate and potassium tert-butoxide to obtain the polymer (VII).

EXAMPLE IV

The compound (V) was reacted with di-tert-butyldicarbonate and potassium tert-butoxide in a solvent to produce N-4-tert-butoxyphenyl maleimide. In the presence of a radical initiator, this product was reacted with the compound (V) in a solvent to give the polymer (VII).

As seen in the chemical structure of the polymaleic imide resin, the cyclic moiety is stable because the aromatic ring, the unshared electron pairs of oxygen and nitrogen atoms and the double bonds of two carbonyl groups, form a resonance structure. In addition, this resonance structure does not absorb an ultra violet beam with a wavelength of 193 nm. Thus, the composition of the present invention can be used to form a photoresist film pattern superior in etching resistance and thermal resistance, as well as being suitable for DUV.

The photoresist composition comprising the poly-N-e-hydroxyphenyl maleimide-co-N-4-ethoxymethoxyphenyl maleimide resin according to the present invention can be applied in a lithography as follows.

First, after being coated on a semiconductor substrate, the photoresist composition is soft-baked at a temperature of 80–250° C. and exposed through a mask to a light source with a wavelength of 200 nm or shorter. Then, a developing process is carried out using an alkaline solution, such as tetramethyl ammonium hydroxide, to form a photoresist film pattern. It is cured at 100–250° C. by a post exposure bake process.

As described hereinbefore, the photoresist film according to the present invention is prepared from an aromatic resin having a cyclic structure which enables DUV with a wavelength of 200 nm or shorter to be used as a light source. In addition, the photoresist film is of high etch resistance and thermal resistance by virtue of its male imide moiety. The use of the photoresist film according to the present invention allows a selection of a light source with a short wavelength necessary for forming fine pattern, which is advantageous for the high integration of semiconductor devices. Such a short wavelength light source increases the focus depth, so that the production yield and reliability of the semiconductor devices can be significantly improved.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other than those specifically described.

What is claimed is:

1. A photoresist composition comprising a copolymer resin, a photosensitive acid generator and additives, wherein said resin has the following structure formula:

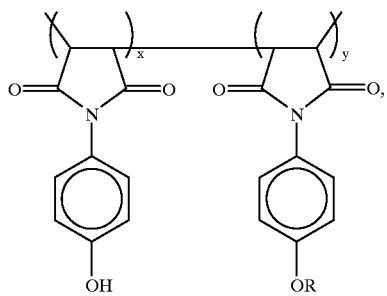

wherein

R functions as a dissolution inhibitor and is selected from the group consisting of 2-tetrahydropyranyl, 2-methyl-2-tetrahydroxypyranyl, 2-methyl-2-tetrahydrofuranyl, tert-butyl, tert-butoxvethyl, 2-methoxy-2-propyl, 2-ethoxy-2-propyl, 2-methylpropoxyethyl, methylethoxy-2-propyl, and ethoxyethyl;

the molar ratio of x and y ranges from 98:2 to 2:98; and wherein said photoresist composition forms fine patterns upon exposure to a wavelength of no greater than 200 nm.

2. A Photoresist composition in accordance with claim 1, wherein said resin is poly (N-4-hydroxyphenyl maleimide-co-N-4-ethoxymethoxyphenyl maleimide).

* * * * *

UNITED STATES PATENT AND TRADEMARK OFFICE
CERTIFICATE OF CORRECTION

PATENT NO. : 6,017,676
DATED : Jan. 25, 2000
INVENTOR(S) : Jung et al.

It is certified that error appears in the above-identified patent and that said Letters Patent is hereby corrected as shown below:

Column 8,
Claim 1, line 4, replace "tert-butoxvethyl" with

--tert-butoxyethyl--.

Signed and Sealed this

Twentieth Day of February, 2001

Attest:

NICHOLAS P. GODICI

Attesting Officer

Acting Director of the United States Patent and Trademark Office